United States Patent [19]
Yee et al.

[11] Patent Number: 5,029,280
[45] Date of Patent: Jul. 2, 1991

[54] ECL CIRCUIT FOR RESISTANCE AND TEMPERATURE BUS DROP COMPENSATION

[75] Inventors: Loren W. Yee, Milpitas; Nim C. Lam, Sunnyvale, both of Calif.

[73] Assignee: National Semiconductor Corp., Santa Clara, Calif.

[21] Appl. No.: 442,041

[22] Filed: Nov. 28, 1989

Related U.S. Application Data

[63] Continuation-in-part of Ser. No. 181,014, Apr. 13, 1988, Pat. No. 4,931,665.

[51] Int. Cl.$^5$ .......................... H03K 3/01; H03K 3/26
[52] U.S. Cl. .............................. 307/296.6; 307/303.1; 307/465.1; 307/475; 307/491
[58] Field of Search ...................... 307/296.6, 455, 475, 307/465, 465.1, 466, 467, 303.1; 323/303.1

[56] References Cited

U.S. PATENT DOCUMENTS

| | | | |
|---|---|---|---|
| 3,573,488 | 4/1971 | Beelitz | 307/467 |
| 4,547,881 | 10/1985 | Varadarajan | 307/455 |
| 4,623,802 | 11/1986 | Cline | 307/455 |
| 4,678,935 | 7/1987 | Nawata et al. | 307/455 |
| 4,931,665 | 6/1990 | Yee | 307/455 |

Primary Examiner—Stanley D. Miller
Assistant Examiner—Richard Roseen
Attorney, Agent, or Firm—Lee Patch; Robert C. Colwell; James A. Deland

[57] ABSTRACT

A voltage is provided by a master circuit and received by a plurality of slave circuits over a bus. The master circuit includes a $V_{bb}$ reference circuit, a temperature compensation and $V_{cse}$ reference circuit, and a voltage step-up and buffering circuit coupled to the bus. Each of the slave circuits has a pair of transistors coupled to the bus in an emitter-follower configuration to step down the voltage from the master circuit and to provide a voltage reference. The voltage provided to the bus varies as it propagates through the bus. Accordingly, a plurality of unconnected resistors are formed in the portions of the silicon substrate which contain the master and/or slave circuits. When formed in the master circuit, the resistors are located in the $V_{bb}$ reference circuit. When formed in the slave circuit, the resistors are located in close proximity to the output transistors. One or more of the resistors may be selectively coupled to its respective master or slave circuit for compensating for voltage drops along the bus.

50 Claims, 4 Drawing Sheets

ECL CIRCUIT FOR RESISTANCE AND TEMPERATURE BUS DROP COMPENSATION

This application is a continuation-in-part of application Ser. No. 07/181,014 filed 4/13/88, now U.S. Pat. No. 4,931,665.

BACKGROUND OF THE INVENTION

The present invention relates to electrical circuits and, more particularly, to emitter-coupled logic circuits applicable to gate array designs.

Gate arrays are semiconductor devices with standard doping layers and customizable metallization layers. Gate arrays allow a design effort to obtain application specific integrated circuits while avoiding the long lead times involved in designing a circuit from scratch. Since they are neither off-the-shelf items, nor entirely customized circuits, gate arrays are considered semi-custom devices. Gate arrays can be fabricated according to a variety of process technologies such as complementary metal-on-oxide (CMOS) and bipolar emitter-coupled logic (ECL) technologies.

When high speeds are required, ECL is often the technology of choice. Rather than switching current on and off as in conventional CMOS circuits, ECL circuits redirect a constant magnitude network current through alternate paths. A typical ECL circuit includes a voltage source, a current network, and a gating system. The voltage source is generally referred to by separate high ($V_{cc}$) and low ($V_{ee}$) voltage components. The voltage source applies a potential difference across the network so as to generate a current through one, or sometimes more, of the paths that constitute the network. The gating system determines the path or paths through which the network current flows at any given time.

An elementary gate includes a "switching" transistor and a "reference" transistor. The transistors are characterized by the voltages applied to their bases. The voltage applied to the base of a "reference" transistor is a constant reference voltage ($V_{bb}$), usually between $V_{cc}$ and $V_{ee}$. The voltage applied to the base of a "switching" transistor is usually discretely variable between a voltage above $V_{bb}$ and a voltage below $V_{bb}$.

The operation of the elementary gate is straightforward. When the voltage at the base of the switching transistor is below the reference voltage $V_{bb}$, current flows from the high voltage source, through the reference transistor via its respective load resistor, and eventually to the low voltage source. Alternatively, when the voltage applied to the base of the switching transistor is higher than the reference voltage $V_{bb}$, current flows through the switching transistor. Thus, the path of the current through the gate is determined by controlling the voltage at the base of the switching transistor.

Because a typical ECL circuit may have many current networks and many gates, the reference voltage source typically is coupled to the circuit components through a bus. At the lower currents employed in conventional circuits, this proves t o be a reliable method for distributing the reference voltage $V_{bb}$ throughout the system because the resistivity of the bus is ordinarily negligible. However, present-day ECL circuits must accommodate currents on the order of two or more amperes. The present inventors have discovered that because of such high currents and the temperature variations they cause, the reference voltage often drops significantly as it propagates through the bus. Consequently, circuit components disposed on the end of the bus and away from the reference voltage source receive a voltage which differs significantly from the intended reference voltage, so the actual current paths within the ECL circuit vary from the expected current path for a given reference potential. Although one solution to the problem is limiting the length of the reference voltage bus and providing multiple sources of the reference voltage, the cost of the multiple reference voltage sources and the constraints imposed by short bus lengths would be prohibitive given the competitive condition of the gate array industry.

SUMMARY OF THE INVENTION

The present invention is directed to a standard ECL circuit package which may be customized to compensate for reference voltage drops along a bus coupled to the reference voltage generating circuit. In one embodiment of the present invention, voltage reference levels are provided using a master circuit and a plurality of slave circuits coupled to the master circuit through a bus. The master circuit includes a $V_{bb}$ reference circuit, a temperature compensation and $V_{cse}$ reference circuit, and a voltage step-up and buffering circuit coupled to the bus. Each of the slave circuits has a pair of transistors coupled to the bus in an emitter-follower configuration to step down the voltage from the master circuit and drive the circuitry requiring the voltage reference.

A plurality of unconnected resistors are formed in the portions of the silicon substrate which contain the master and/or slave circuits. When formed in the master circuit, the resistors are located in the $V_{bb}$ reference circuit. When formed in the slave circuit, the resistors are located in close proximity to the output transistor. One or more of the resistors may be selectively coupled to its respective master or slave circuit for compensating for voltage drops along the bus. Preferably, the resistors are coupled through the metallization layers in the finished product. This allows bus voltage drop compensation to be effected part of the normal package customization, without requiring expensive added circuitry.

These and other features and advantages of the invention will become apparent to those skilled in the art upon a reading of the following detailed description of the invention, which should be taken in conjunction with the accompanying drawings.

DETAILED DESCRIPTION OF THE PREFERRED EMBODIMENTS

Figure 1:
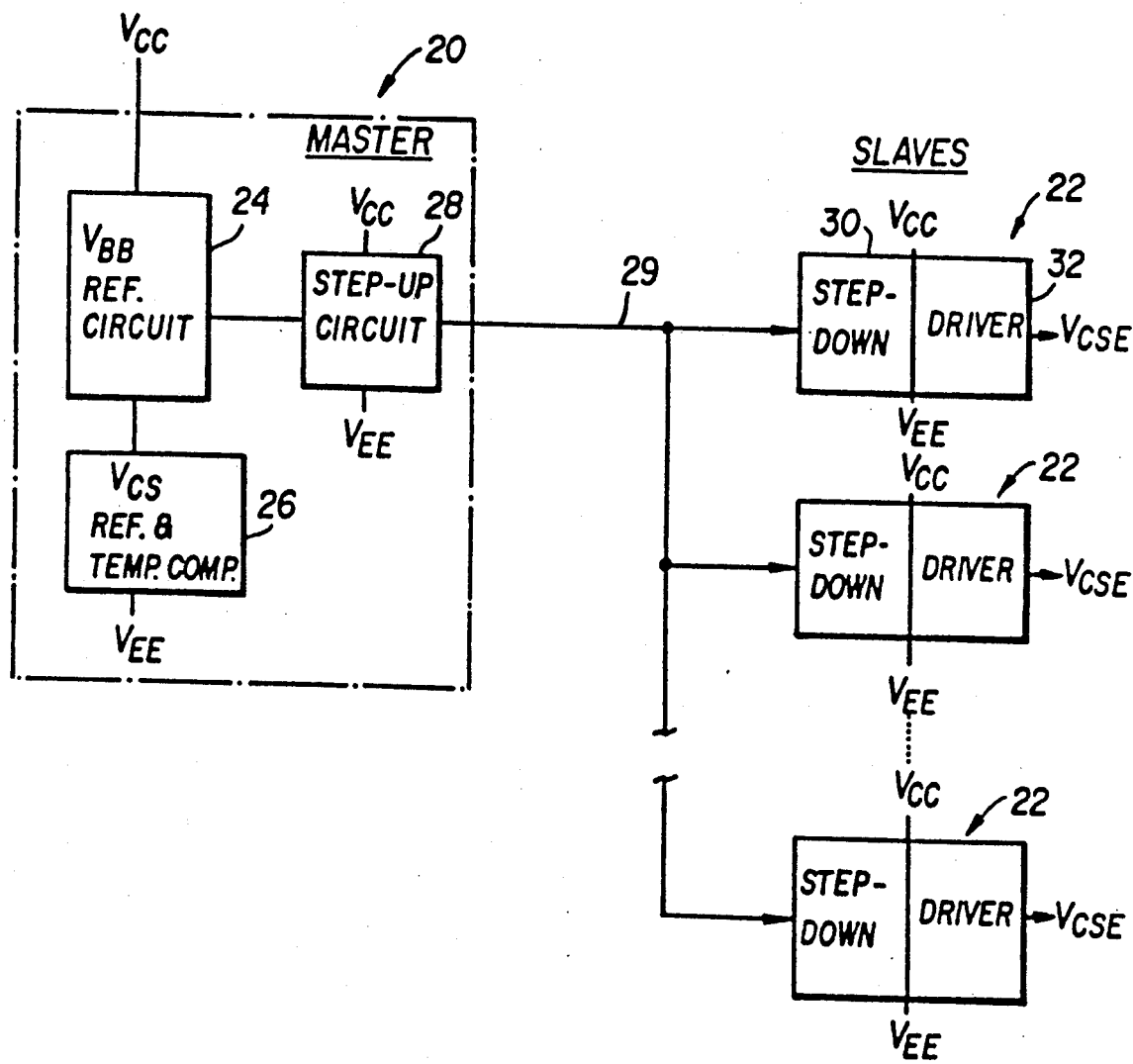
FIG. 1 is a block diagram of a particular embodiment of a master-slave circuit for producing a reference voltage according to the present invention.

FIG. 1 is a block diagram of a particular embodiment of the present invention showing a master circuit 20 and a plurality of slave circuits 22. The master circuit includes a $V_{bb}$ reference circuit 24, a $V_{cs}$ reference circuit and temperature compensation circuit 26, and a step-up and buffer circuit 28 coupled to a bus 29. Each of the slave circuits has a step-down transistor 30 coupled to bus 29 and a driver transistor 32. The step-down transistor also acts as a driver in an emitter-follower configuration with driver 32.

Figure 2:
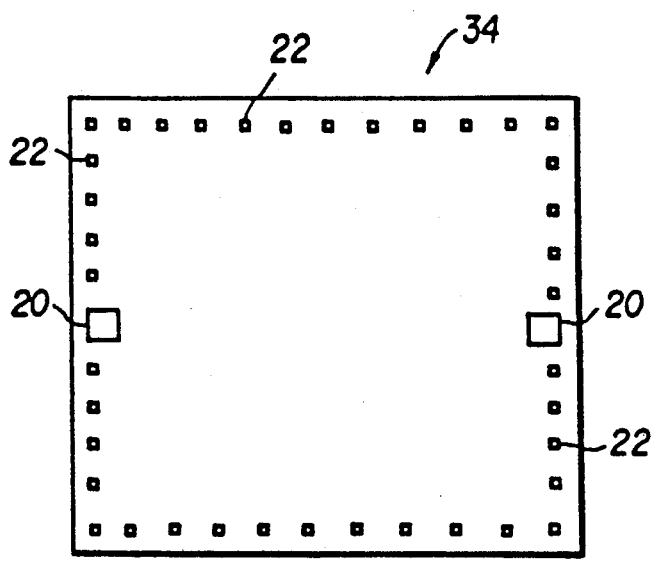
FIG. 2 is a diagram of a particular embodiment of a semiconductor chip showing the arrangement of the master and slave circuits of FIG. 1.

FIG. 2 shows the arrangement of the circuit of the present invention on a semiconductor chip 34. A pair of master circuits 20 are shown on two sides of the chip, with a large number of slave circuits 22 arranged around the edges. Typically, one master circuit may be used for 90 slave circuits, with each slave circuit driving 35 logic cells.

Figure 3:
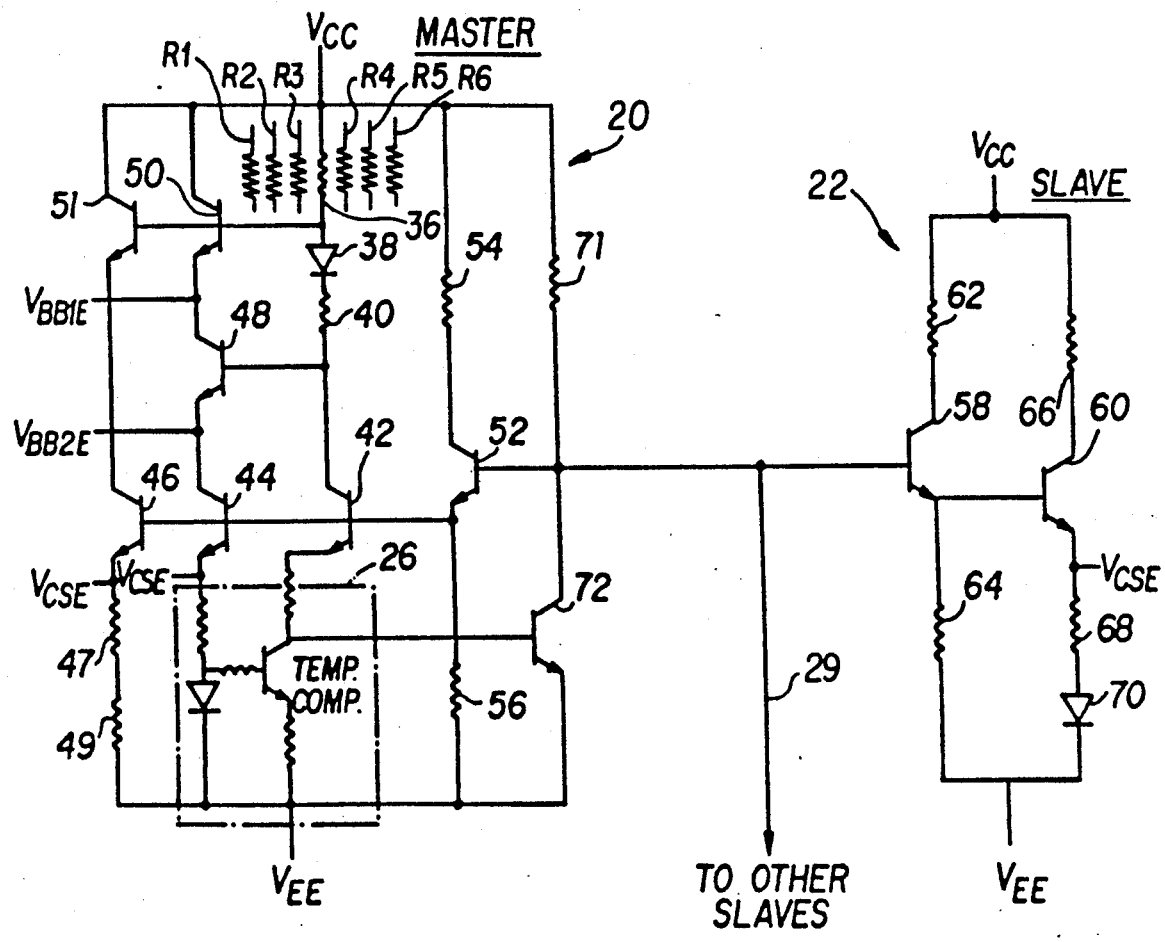
FIG. 3 is a schematic diagram of the master/slave circuit according to FIG. 1 showing a particular embodiment of compensation resistors according to the present invention.

FIG. 3 is a schematic diagram of one embodiment of a master circuit 20 and a slave circuit 22 illustrating a reference voltage drop compensating apparatus according to the present invention. A $V_{bb}$ reference circuit is provided through resistor 36, diode 38 and resistor 40. The current from this $V_{bb}$ reference circuit is provided to a transistor 42 which has its emitter coupled to a temperature compensation circuit 26. The base of transistor 42 is also coupled to transistors 44 and 46 which provide a $V_{cse}$ voltage reference at their emitters. A pair of transistors 48 and 50 provide level shifting to $V_{bb1e}$ and $V_{bb2e}$, respectively. The current through resistor 36, diode 38 and resistor 40 essentially sets up the $V_{bb1e}$ and $V_{bb2e}$ levels and is generated from the $V_{cs}$ reference circuit. The circuit according to the present invention shifts up the voltage at the base of transistor 42, 44 and 46 by one diode level by the addition of a transistor 52. Transistor 52 is coupled to $V_{cc}$ through resistor 54 and to $V_{ee}$ through a resistor 56, which provides a level shifting function. The base of transistor 52 is coupled to the base of a transistor 58 in each slave circuit through bus 29. A plurality of unconnected resistors R1-R6 are disposed in close proximity to resistor 36 in master circuit 20 to compensate for voltage drops along bus 29 in a manner discussed below.

Each transistor 58 provides a beta drop down to the level of transistor 42 at the base of an output transistor 60. In addition, resistors 62 and 64 are coupled to transistor 58 to provide a match to resistors 54 and 56 of transistor 52 to provide the same current density and cancel temperature effects.

Transistor 52 not only steps up the voltage by one diode level, but also buffers out the temperature and beta effects of transistors 42, 44 and 46. Transistor 58 not only steps the voltage back down, but provides the current needed by output transistor 60, thus reducing the current needed to be produced from the master circuit to the base of transistor 58.

A resistor 66 coupled to output transistor 60 is provided to prevent collector-emitter breakdown. Additionally, a resistor 68 and a diode 70 are coupled to the emitter of transistor 60 and $V_{ee}$ to drive ECL input within the die.

The base of transistor 52 is coupled to the collector of transistor 72 and level shifts the collector of transistor 72 to a voltage two $V_{be}$ ( ) above $V_{cse}$ as a result of the voltage drop from the base to the emitter of transistors 46 and 52. Transistors 58 and 60 in each slave circuit shift the voltage down two to recreate voltage $V_{cse}$.

Figure 4:
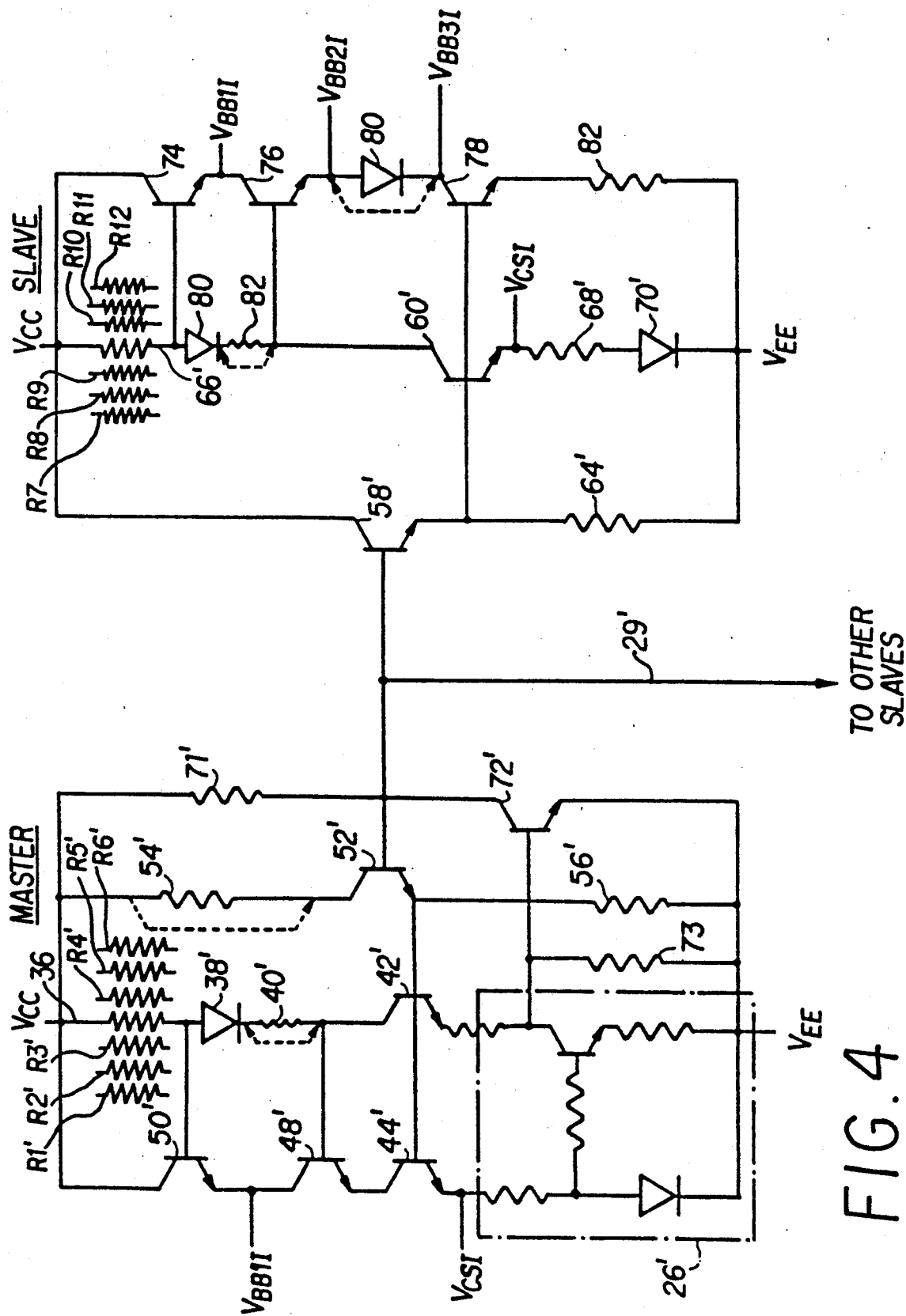
FIG. 4 is a schematic diagram of an alternative embodiment of a master/slave circuit for producing a reference voltage showing compensation resistors according to the present invention.

Transistors 51 and 46 and resistors 47 and 49 provide extra drive capability, and could be eliminated where not needed, as shown in FIG. 4.

FIG. 4 shows an alternate embodiment of the present invention intended for use where the master circuit is on the same semiconductor chip as the slave circuits. The elements shown with a prime symbol (i.e., R1') correspond to the same element in FIG. 3 (i.e., R1). One difference is the addition of a third leg to the slave circuit having transistors 74, 76 and 78 along with optional diode 80 and resistor 82. This circuit allows the slave circuit to produce two or three higher voltage reference level signals. An extra resistor 73 has been added in the master circuit to adjust the temperature compensation from the 100K bias driver shown in FIG. 3 to a 10K bias driver shown in FIG. 4. Finally, a plurality of unconnected resistors R7-R12 are disposed in close proximity to resistor 66' in the slave circuit to compensate for voltage drops along bus 29 in a manner discussed below.

Resistors R1-R6 may be used to alter the voltage provided to bus 29, 29' by master circuit 20, 20', whereas resistors R7-R12 may be used to compensate for the voltage received over bus 29' by slave circuit 22'. Altering the reference voltage of master circuit 20 is useful when plurality of slave circuits are located at substantially the same distance from the master circuit. Altering the reference voltage at slave circuit 22 is useful when the slave circuits are distributed along the length of bus 29 (e.g., as arranged in FIG. 2).

Figure 5:
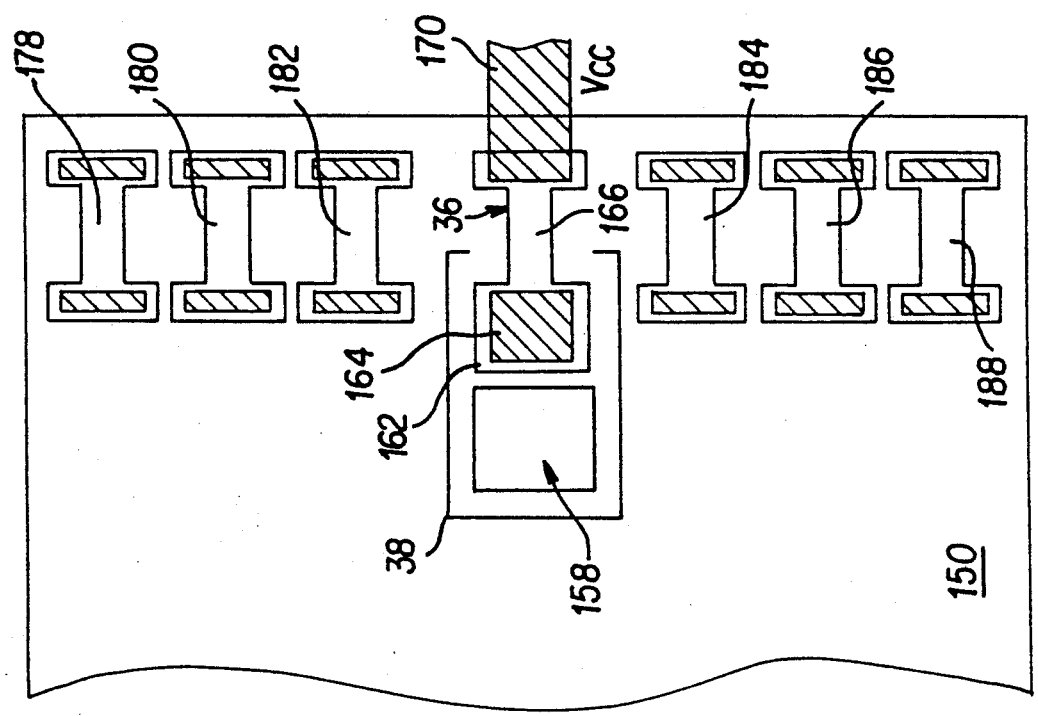
FIG. 5 is a diagram of a semiconductor chip showing compensation resistors formed therein according to the present invention.

FIG. 5 is a diagram of the portion of a silicon substrate 50 which contains resistor 36 and diode 38 in master circuit 20. Alternatively, the figure conceptually represents resistor 66 and a portion of transistor 60 (FIG. 3) or resistor 66 and diode 80 (FIG. 4) in slave circuit 22, so the following discussion is applicable to slave circuit 22 as well. Diode 38 (or diode 80/transistor 60) includes a first conductivity type region 158 and a second conductivity type region 162. Second conductivity type region 162 is coupled through a portion of a metallization layer 164 to a resistance region 166 which forms resistor 36 (or resistor 66). Resistance region 166, in turn, is connected to a line 170 which is part of a metallization layer that receives $V_{cc}$. As shown, substrate 150 includes a plurality of resistance regions 178–188 which form resistors R1-R6 (or resistors R7-R12 in slave circuit 22), respectively. Resistance regions 178–188 are unconnected in the standard package.

Figure 6:
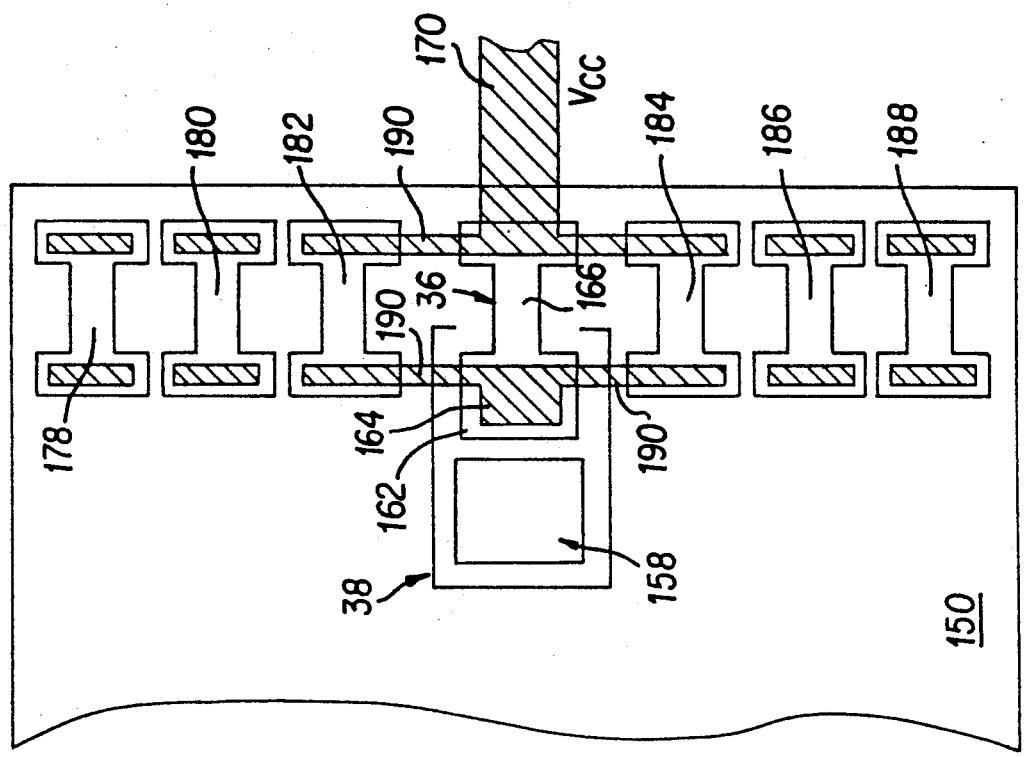
FIG. 6 is a diagram of the semiconductor chip of FIG. 5 showing the compensation resistors interconnected by a metallization layer according to the present invention.

When the master and slave circuits are purchased by the circuit designer, the electrical characteristics of the final circuit must be determined. For altering the master circuit when the slave circuits are located at a substantially equal distance from the master circuit, the location of the slave circuits with respect to their associated master circuit is determined, and the temperature at which the circuit will operate is calculated. From this information, the actual voltage that will be received by slave circuits 22 over bus 29 may be determined. Once the actual voltage received by the slave circuits is known, selected ones of resistors R1-R6 in master circuit 20 are coupled to resistance region 166 (resistor 36)

through leads formed by the metallization process used to customize the chip. For example, as shown in FIG. 6, resistors R3 and R4 may be connected in parallel with resistance region 166 through a metal layer 190. This alters the voltage provided to bus 29 to compensate for the calculated voltage drop along the bus.

Similarly, when the slave circuits are distributed along bus 29, then the location of each slave circuit 22 with respect to its associated master circuit 20 is determined, and the temperature at which the circuit will operate is calculated. From this information, the actual voltage that will be received by each above circuit 22 over bus 29 may be determined. Once the actual voltage received by each slave circuit is known, selected areas of resistors R7-R12 (resistance regions 178-188 in FIG. 5) in each slave circuit 22 are coupled to resistance region 166 (resistor 66) through leads formed by the metallization process used to customize the chip.

By providing a plurality of unconnected resistors in the standard die, the circuit designer is free to adjust the voltage generated by master circuit 20 or received by slave circuits 23 and hence maintain proper operation of the circuit. This is done without requiring additional power supplies or external circuitry.

While the above is a complete description of a preferred embodiment of the present invention, various modifications may be employed. For example, resistors R1-R12 may comprise any substrate feature capable of functioning as such. Resistors may be selectively added or omitted from the master circuit 20 and/or slave circuit 22. Consequently, the scope of the invention should not be limited except as described in the claims.

I claim:

1. In a circuit wherein a transistor in an ECL gate array formed in a silicon substrate is coupled to a voltage source through a bus for receiving a voltage therefrom and forms a complete current path from the voltage source to a voltage sink, the voltage emitted by the voltage source varying as it propagates through the bus, an apparatus for compensating for the voltage received by the transistor comprising:
   an unconnected resistance formed in the substrate in close proximity to the transistor for being selectively coupled to the transistor during customization.

2. In a circuit wherein a transistor in an ECL gate array formed in a silicon substrate is coupled to a voltage source and to a bus for providing a voltage to the bus and forms a complete current path from the voltage source to a voltage sink, the voltage provided to the bus varying as it propagates through the bus, an apparatus for adjusting the voltage provided to the bus by the transistor comprising:
   an unconnected resistance formed in the substrate in close proximity to the transistor for being selectively coupled to the transistor during customization.

3. A circuit for producing a reference voltage from a supply voltage comprising:
   a bus;
   a master circuit formed in a silicon substrate, the master circuit having a first transistor coupled to the supply voltage and to the bus for providing an intermediate voltage to the bus, the intermediate voltage varying as it propagates through the bus;
   a slave circuit coupled to the master circuit through the bus for receiving the intermediate voltage therefrom, the slave circuit including a second transistor for providing the reference voltage in response to the intermediate voltage; and
   wherein the master circuit includes uncoupled compensation means, disposed in close proximity to the first transistor, for adjusting the value of the intermediate voltage provided to the bus during customization by selective coupling.

4. A circuit for producing a reference voltage from a supply voltage comprising:
   a bus;
   a master circuit formed in a silicon substrate, the master circuit having a first transistor coupled to the supply voltage and to the bus for providing an intermediate voltage to the bus, the intermediate voltage varying as it propagates through the bus;
   a slave circuit coupled to the master circuit through the bus for receiving the intermediate voltage therefrom, the slave circuit including a second transistor for providing the reference voltage in response to the intermediate voltage; and
   wherein the master circuit includes compensation means, coupled to the first transistor, for adjusting the value of the intermediate voltage provided to the bus, the compensating means comprising a plurality of unconnected resistances formed in the substrate in close proximity to the first transistor for being selectively coupled to the transistor during customization by selective coupling.

5. The circuit according to claim 4 further comprising coupling means for selectively coupling the plurality of resistance to the first transistor.

6. The circuit according to claim 5 wherein the coupling means comprises a metallization layer disposed over the substrate.

7. The circuit according to claim 5 wherein the coupling means selectively couples the plurality of resistances between the first transistor and the supply voltage.

8. The circuit according to claim 7 wherein the coupling means selectively couples the plurality of resistances to a collector of the first transistor.

9. The circuit according to claim 8 wherein the coupling means selectively couples the plurality of resistances in parallel with each other.

10. The circuit according to claim 9 wherein the coupling means comprises a metallization layer disposed over the substrate.

11. A circuit for producing a reference voltage from a supply voltage comprising:
    a bus;
    a master circuit formed in a silicon substrate, the master circuit having a first transistor coupled to the supply voltage and to the bus for providing an intermediate voltage to the bus, the intermediate voltage varying as it propagates through the bus;
    a slave circuit coupled to the master circuit through the bus for receiving the intermediate voltage therefrom, the slave circuit including a second transistor for providing the reference voltage in response to the intermediate voltage; and
    wherein the slave circuit includes compensation means, coupled to the second transistor, for compensating for the value of the intermediate voltage received over the bus.

12. The circuit according to claim 11 wherein the compensation means further comprises a plurality of unconnected resistances formed in the substrate in close proximity to the second transistor for being selectively coupled to the transistor during customization.

13. The circuit according to claim 12 further comprising coupling means selectively coupling the plurality of resistances to the second transistor.

14. The circuit according to claim 13 wherein the coupling means comprises a metallization layer disposed over the substrate.

15. The circuit according to claim 13 wherein the second transistor is coupled to the supply voltage, and wherein the coupling means selectively couples the plurality of resistances between the second transistor and the supply voltage.

16. The circuit according to claim 15 wherein the coupling means selectively couples the plurality of resistances to a collector of the second transistor.

17. The circuit according to claim 16 wherein the coupling means selectively couples the plurality of resistances in parallel with each other.

18. The circuit according to claim 17 wherein the coupling means comprises a metallization layer disposed over the substrate.

19. A circuit for producing a reference voltage level from a supply voltage comprising:
   a bus;
   a master circuit formed in a silicon substrate including:
      a Vcs circuit for producing a Vcs reference voltage, the Vcs circuit including a first resistance and a diode coupled to the supply voltage;
      first voltage producing means, coupled to the Vcs reference circuit, for producing a first voltage larger than the reference voltage by the base-emitter voltage drop of a transistor in the Vcs reference circuit;
      step-up means, coupled to the voltage producing means and to the bus, for producing a second voltage to the bus larger than the first voltage by the base-emitter voltage drop of a transistor in the step-up means;
      uncoupled compensation means, disposed in close proximity to the first resistor, for adjusting the value of the second voltage provided to the bus during customization by selective coupling; and
   a slave circuit coupled to the bus for receiving the second voltage therefrom and for producing the reference voltage level in response thereto, the slave circuit including first and second cascaded transistors coupled in an emitter-follower configuration wherein the emitter of the first transistor is coupled to the base of the second transistor.

20. A circuit for producing a reference voltage level from a supply voltage comprising:
   a bus;
   a master circuit formed in a silicon substrate including:
      a Vcs circuit for producing a Vcs reference voltage, the Vcs circuit including a first resistance and a diode coupled to the supply voltage;
      first voltage producing means, coupled to the Vcs reference circuit, for producing a first voltage larger than the reference voltage by the base-emitter voltage drop of a transistor in the Vcs reference circuit;
      step-up means, coupled to the voltage producing means and to the bus, for producing a second voltage to the bus larger than the first voltage by the base-emitter voltage drop of a transistor in the step-up means;
      compensation means, coupled to the first resistance, for adjusting the value of the second voltage provided to the bus, the compensation means comprising a plurality of unconnected second resistances formed in the substrate in close proximity to the first resistance for being selectively coupled to the first resistance during customization; and
   a slave circuit coupled to the bus for receiving the second voltage therefrom and for producing the reference voltage level in response thereto, the slave circuit including first and second cascaded transistors coupled in an emitter-follower configuration wherein the emitter of the first transistor is coupled to the base of the second transistor.

21. The circuit according to claim 20 further comprising coupling means for selectively coupling the plurality of second resistances to the first resistance.

22. The circuit according to claim 21 wherein the coupling means comprises a metallization layer disposed over the substrate.

23. The circuit according to claim 22 wherein the coupling means selectively couples the plurality of second resistances in parallel with the first resistance.

24. A circuit for producing a reference voltage level from a supply voltage comprising:
   a bus;
   a master circuit formed in a silicon substrate including:
      a Vcs circuit for producing a Vcs reference voltage, the Vcs circuit including a first resistance and a diode coupled to the supply voltage;
      first voltage producing means, coupled to said Vcs reference circuit, for producing a first voltage larger than the reference voltage by the base-emitter voltage drop of a transistor in the Vcs reference circuit;
      step-up means, coupled to the voltage producing means and to the bus, for producing a second voltage to the bus larger than the first voltage by the base-emitter voltage drop of a transistor in the step-up means, wherein the second voltage varies as it propagates through the bus; and
   a slave circuit formed in a silicon substrate and coupled to the bus for receiving the second voltage therefrom and for producing the reference voltage level in response thereto, the slave circuit including:
      first and second cascaded transistors coupled in an emitter-follower configuration wherein the emitter of the first transistor is coupled to the base of the second transistor; and
      first compensation means, coupled to the second transistor, for compensating for the value of the second voltage received over the bus.

25. The circuit according to claim 24 wherein the first compensation means further comprises a plurality of unconnected second resistances formed in the substrate in close proximity to the second transistor for being selectively coupled to the second transistor during customization.

26. The circuit according to claim 25 further comprising coupling means for selectively coupling the plurality of second resistances to the second transistor.

27. The circuit according to claim 26 wherein the coupling means comprises a metallization layer disposed over the substrate.

28. The circuit according to claim 26 wherein the second transistor is coupled to the supply voltage, and wherein the coupling means selectively couples the plurality of second resistances between the second transistor and the supply voltage.

29. The circuit according to claim 28 wherein the coupling means selectively couples the plurality of second resistances to a collector of the second transistor.

30. The circuit according to claim 29 wherein the coupling means selectively couples the plurality of second resistances in parallel with each other.

31. The circuit according to claim 30 wherein the coupling means comprises a metallization layer disposed over the substrate.

32. The circuit according to claim 25 wherein the master circuit further comprises second compensation means, coupled to the first resistor, for adjusting the value of the second voltage provided to the bus.

33. The circuit according to claim 32 wherein the second compensation means further comprises a plurality of unconnected third resistances formed in the substrate in close proximity to the first resistor for being selectively coupled to the first resistance during customization.

34. The circuit according to claim 33 further comprising coupling means for selectively coupling the plurality of third resistance to the first resistance.

35. The circuit according to claim 34 wherein the coupling means comprises a metallization layer disposed over the substrate.

36. The circuit according to claim 35 wherein the metallization layer selectively couples the plurality of third resistances to the first resistance.

37. The circuit according to claim 36 wherein the metallization layer selectively couples the plurality of second resistances to the second transistor.

38. The circuit according to claim 37 wherein the metallization layer selectively couples the plurality of third resistances in parallel with the first resistance, and wherein the metallization layer selectively couples the plurality of second resistances in parallel between the second transistor and the supply voltage.

39. In a circuit wherein a transistor in an ECL gate array formed in a silicon substrate is coupled to a voltage source through a bus for receiving a voltage therefrom, the voltage emitted by the voltage source varying as it propagates through the bus, an apparatus for compensating for the voltage received by the transistor comprising:
an unconnected resistance formed in the substrate in close proximity to the transistor for being selectively coupled to a terminal of the transistor in parallel therewith during customization.

40. The circuit according to claim 39 further comprising coupling means for coupling the resistance to the transistor in parallel therewith.

41. The circuit according to claim 38 wherein the coupling means comprises a metallization layer disposed over the substrate.

42. In a circuit wherein a transistor in an ECL gate array formed in a silicon substrate is coupled to a voltage source and to a bus for providing a voltage to the bus, the voltage provided to the bus varying as it propagates through the bus, an apparatus for adjusting the voltage provided to the bus by the transistor comprising:
an unconnected resistance formed in the substrate in close proximity to the transistor for being selectively coupled to a terminal of the transistor in parallel therewith during customization.

43. The circuit according to claim 42 further comprising coupling means for coupling the resistance to the transistor in parallel therewith.

44. The circuit according to claim 43 wherein the coupling means comprises a metallization layer disposed over the substrate.

45. In a circuit wherein a transistor in an ECL gate array formed in a silicon substrate is coupled to a voltage source through a bus for receiving a voltage therefrom, the voltage emitted by the voltage source varying as it propagates through the bus, an apparatus for compensating for the voltage received by the transistor comprising:
a plurality of unconnected resistances formed in the substrate in close proximity to the transistor for being selectively coupled to the transistor during customization.

46. The circuit according to claim 45 further comprising coupling means for coupling the plurality of resistances to the transistor.

47. The circuit according to claim 46 wherein the coupling means comprises a metallization layer disposed over the substrate.

48. In a circuit wherein a transistor in an ECL gate array formed in a silicon substrate is coupled to a voltage source and to a bus for providing a voltage to the bus, the voltage provided to the bus varying as it propagates through the bus, an apparatus for adjusting the voltage provided to the bus by the transistor comprising:
a plurality of unconnected resistances formed in the substrate in close proximity to the transistor for being selectively coupled to the transistor during customization.

49. The circuit according to claim 48 further comprising coupling means for coupling the plurality of resistances to the transistor.

50. The circuit according to claim 49 wherein the coupling means comprises a metallization layer disposed over the substrate.

* * * * *